United States Patent [19]

Herb et al.

[11] Patent Number: 5,496,596

[45] Date of Patent: * Mar. 5, 1996

[54] METHODS FOR PRODUCING DIAMOND MATERIALS WITH ENHANCED HEAT CONDUCTIVITY

[75] Inventors: John A. Herb, Palo Alto; John M. Pinneo, Redwood City; Clayton F. Gardinier, San Francisco, all of Calif.

[73] Assignee: Crystallume, San Jose, Calif.

[*] Notice: The portion of the term of this patent subsequent to Dec. 21, 2010, has been disclaimed.

[21] Appl. No.: 188,279

[22] Filed: Jan. 28, 1994

Related U.S. Application Data

[60] Continuation of Ser. No. 95,314, Jul. 21, 1993, Pat. No. 5,316,842, which is a division of Ser. No. 789,732, Nov. 8, 1991, Pat. No. 5,284,709, which is a continuation of Ser. No. 704,997, May 24, 1991, which is a continuation of Ser. No. 413,114, Sep. 27, 1989, Pat. No. 5,075,095, which is a continuation of Ser. No. 204,058, Jun. 7, 1988, Pat. No. 4,882,138, which is a continuation of Ser. No. 32,167, Mar. 30, 1987, Pat. No. 4,743,073.

[51] Int. Cl.⁶ ............................ B05D 3/06; C23C 16/26
[52] U.S. Cl. .................. 427/577; 427/249; 427/255.7; 264/81
[58] Field of Search .................. 427/577, 575, 427/573, 249, 255.7, 122; 428/408; 264/81

[56] References Cited

U.S. PATENT DOCUMENTS

| | | | |
|---|---|---|---|
| 4,707,384 | 11/1987 | Schachner et al. | 427/255.3 |
| 4,909,133 | 3/1990 | Taylor et al. | 92/212 |
| 5,124,179 | 6/1992 | Garg et al. | 427/587 |
| 5,130,111 | 7/1992 | Pryor | 427/249 |
| 5,271,971 | 12/1993 | Herb et al. | 427/577 |

*Primary Examiner*—Shrive Beck
*Assistant Examiner*—Bret Chen
*Attorney, Agent, or Firm*—D'Alessandro & Ritchie

[57] ABSTRACT

A method for growing a diamond film, substantially free of voids, having an average crystallite size greater than about 15 microns, a maximum intensity of the diamond Raman peak in counts/sec divided by the intensity of photoluminescence at 1270 cm$^{-1}$ greater than about 3, a Raman sp$^3$ full width half maximum less than about 6 cm$^{-1}$, and a diamond-to-graphite Raman ratio greater than about 25, includes the steps of preparing a substrate by abrasion with diamond particles; placing the substrate in a CVD reactor; depositing diamond during a first deposition stage by providing an atmosphere consisting essentially of a mixture of about 200 sccm $H_2$ and 10 sccm $CH_4$, at a pressure of about 90 Torr, providing between about 1,800 and 1,950 watts of microwave power at a frequency of about 2.45 GHz to ignite and sustain a plasma in the region of said substrate, and maintaining the substrate at a temperature of between about 625° C. and 675° C. for a period of time sufficient to form a diamond layer which is substantially continuous; depositing a diamond during a second deposition stage by providing an atmosphere consisting essentially of a mixture of about 200 sccm $H_2$, 4.6 sccm CO, and 9 ccm of $CH_4$ at a pressure of about 90 Torr, providing between about 1,800 and 1,950 watts of microwave power at a frequency of between about 2.45 GHz and maintaining said substrate material at a temperature of between about 625° C. and 675° C. for a period of time sufficient to form a diamond layer having a desired thickness; and removing the substrate material from said CVD reactor.

2 Claims, 6 Drawing Sheets

METHODS FOR PRODUCING DIAMOND MATERIALS WITH ENHANCED HEAT CONDUCTIVITY

RELATED APPLICATIONS

This application is a continuation of application Ser. No. 08/095,314, filed Jul. 21, 1993, now U.S. Pat. No. 5,316, 842, which is a division of application Ser. No. 07/789,732, filed Nov. 8, 1991, now U.S. Pat. No. 5,284,709, which is a continuation in part of application Ser. No. 07/704,997, filed May 24, 1991, which is a continuation of application Ser. No. 07/413,114, filed Sept. 27, 1989, now U.S. Pat. No. 5,075,095, which is a continuation of application Ser. No. 07/204,058, filed Jun. 7, 1988, now U.S. Pat. No. 4,882,138, which is a continuation of application Ser. No. 07/032,167, filed Mar. 30, 1987, now U.S. Pat. No. 5,743,073.

FIELD OF THE INVENTION

The present invention relates to synthetic diamond materials and articles. More specifically, the present invention relates to synthetic diamond material and articles having thermal conductivity greater than 17 watts/cm/K at about 20° C. Several preferred embodiments are taught, including materials with large grain size, modified isotopic composition, and combinations thereof.

THE PRIOR ART

It has long been known that diamond, in either its natural or synthetic single crystal form, is the best available conductor of heat at ordinary temperatures. Specimens of natural type IIa diamond, selected for their purity and relative freedom from internal stress, have demonstrated thermal conductivity as high as approximately 20 watts/cm/° K. at room temperature. In comparison, the best metallic heat conductor (the best known heat conductor but for diamond) is silver, with a thermal conductivity of slightly in excess of 4.3W/cm/° K. The extremely high heat conductivity of diamond makes it an attractive candidate for use in cooling high-power electronic devices.

The independent conduction mechanisms for heat and electric current in diamond underlie its utility as a thermal transfer element in many electronic applications. Thus for devices such as laser diodes, diamond can provide required electrical isolation with simultaneous high thermal conductivity, enabling efficient removal of heat from sensitive devices. There is a strong need for high conductivity diamond to provide more cost-effective, efficient heat transfer components.

There is a wide range of potential thermal applications for diamond. However, the high cost and limited supply of suitable type IIa natural diamond crystals has restricted their use to applications whose requirements can be met with very small crystals (i.e., having areas of about 1 $mm^2$) and which can justify the high cost of selected natural material.

Synthetic diamond materials made by the classic high-pressure, high-temperature process are not suitable for many of the numerous potential thermal applications which could be filled by diamond. The high-pressure, high-temperature diamond materials cannot be made in thin film form, and are even more expensive in large sizes (i.e., greater than about 5 mm) than natural diamonds. Furthermore, single crystals as routinely made for incorporating in abrasive cutting and grinding products are often "doped" with small amounts of incorporated nitrogen during growth to improve their mechanical properties. These nitrogen impurities reduce thermal conductivity by approximately a factor of two, depending on the details of synthesis.

High pressure, high temperature synthetic diamonds can be grown without nitrogen impurities, and therefore with high thermal conductivity, but production costs preclude economic fabrication of diamond thermal transfer elements larger than several square millimeters in size. Therefore, it has not been possible to address applications for which the thermal properties of diamond are suited which require larger areas, or which would require diamond layers which must conform to irregular surfaces.

Heat transfer in diamond occurs through propagation of phonons in the lattice. Phonons are essentially lattice vibrations which are quantized in energy. This heat transfer mechanism is common to many covalently-bonded dielectric materials (e.g., BeO, $Al_2O_3$, etc.) and differs from that of metals, in which both heat and electric current are transported by conduction electrons which are free to move throughout the metal. In contrast, covalently-bonded materials usually have very few free electrons at room temperature, and are therefore good electrical insulators.

The efficiency of heat transfer (phonon propagation) in diamond is limited by a number of independent effects. In general, any structural or chemical inhomogeneity in the crystal lattice causes reflections of phonons and consequent reduction in heat conductivity. In addition, a form of phonon interaction known as Umklapp scattering causes scattering of colliding phonons even in perfect crystal lattices. This effect gives rise to a temperature-dependent reduction of thermal conductivity in diamond at elevated temperatures.

Lattice inhomogeneities known to cause phonon scattering and reduced thermal conduction in diamond include chemical impurities (incorporated nitrogen, boron, or other non-carbon elements), structural nonuniformities (interstitial carbon atoms, carbon vacancies, and other types of defects such as stacking faults), boundaries within single crystals (twinning defects), boundaries between grains in polycrystalline films, and isotopic inhomogeneities.

The isotopic scattering factor arises from the fact that natural carbon consists of a mixture of isotopes, the predominant one being $C^{12}$ comprising about 99 atomic % in naturally occurring carbon forms. The isotope $C^{13}$ is next most abundant, with a concentration of about 1 atomic %. Other isotopes (such as radioactive $C^{14}$) are present in vanishingly small concentrations and are not believed to play a significant role in determining thermal conductivity of diamond.

The presence of 1% of $C^{13}$ in diamond plays a significant part in limiting its thermal conductivity because each $C^{13}$ atom, which is about 8% heavier than the predominant $C^{12}$ isotope, scatters phonons and impedes their propagation through the lattice.

Experiments in measuring thermal conductivity of other covalently-bonded crystals prepared to be isotopically pure have demonstrated that, under conditions where other limiting factors are insignificant, phonon scattering due to isotopic effects can strongly limit heat conduction. These effects have been noted in diverse materials such as germanium and lithium fluoride. It has been long predicted that isotopically pure diamonds might show enhanced thermal conductivity, and recent experimental results have shown that single diamond crystals with reduced $C^{13}$ content show thermal conductivity increased by up to 50% over the best mixed isotope crystals.

Measurements of polycrystalline diamond film thermal conductivity have been published and, with a single exception, have not to date shown the large thermal conductivity noted in the best natural diamond specimens (Type IIa crystals). It has been speculated that small grain size and/or lattice defects have limited diamond film thermal conductivity, but measurements of thermal conductivity of diamond films, synthesized under conditions expected to maximize thermal conductivity, with apparent grain sizes exceeding 25 μm disclosed maximum thermal conductivity levels no greater than those measured for films having grain size smaller by a factor of ten. Lattice defects of an unidentified nature are speculated to be the limiting factor in CVD diamond thermal conductivity, and are specifically suggested as a factor masking the enhanced thermal conductivity expected of isotopically enriched films. The single exception appears in T. Morelli, Phonon-defect scattering in high thermal conductivity diamond films, Applied Physics Letters, Vol. 59, No. 17, Oct. 21, 1991, pp. 2112–2114, but this reference provides no disclosure regarding how to make the films reported therein.

In summary, despite the general knowledge in the art concerning the mechanisms presently understood to affect thermal conductivity of diamond, no published data by expert practitioners in the field of CVD diamond growth have yet shown how to synthesize diamond films with thermal properties approaching those known to be available in the best single-crystal natural material.

BRIEF DESCRIPTION OF THE INVENTION.

According to the present invention, synthetic diamond material and articles are taught having thermal conductivity greater than 17 watts/cm/K measured at about 20° C. Several preferred embodiments are taught, including materials with a grain size larger than about 15 microns, modified isotopic composition, and combinations thereof. Materials comprising composite compositions of diamond and non-diamond materials, and articles made therefrom according to the present invention, also exhibit high thermal conductivities.

These materials make possible the transfer of heat with unprecedented efficiency in a wide variety of applications. Our invention is the synthesis of diamond materials, which if manufactured to manifest a particular set of characteristics, exhibit thermal conductivity substantially greater than those manufactured by other practitioners of the art, and which in fact exceed thermal conductivity values seen in the best natural specimens.

The materials and articles according to the present invention are fully dense films, free of voids, and characterized by an intensity ratio of diamond- Raman-peak-to-photoluminescence background intensity greater than about 20, intensity patio of diamond-Raman-peak-to-Raman-graphite-peak greater than about 25, full-width at ½ maximum intensity of diamond Raman peak less than about 6 cm$^{-1}$, average crystallite diameter greater than about 15 microns. Further the films and articles according to one aspect of the present invention preferably have $C^{13}$ isotopic concentration less than 0.05 atomic %.

Diamond and composite materials prepared to exhibit the above characteristics will exhibit thermal conductivity in excess of 17 W/cm/° K. measured at about 20° C.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons. As used throughout this specification and in the claims herein, the term "chemical vapor deposition" shall be referred to by the known abbreviation "CVD".

According to the present invention, polycrystalline diamond materials and processes for making the films are disclosed. Composite diamond/non-diamond films are also disclosed herein. The diamond and composite materials produced by the present invention have thermal conductivity greater than 17 watts/cm/K measured at about 20° C.

One of the underlying necessary conditions for high-thermal-conductivity diamond is a high degree of structural perfection, as disclosed by Raman spectroscopy. It has been discovered that there is a correspondence between photoluminescence and Raman spectroscopy data and structural characteristics of diamond materials. According to the present invention, the required structural perfection of diamond films may be identified by specifying quantitative limits on certain Raman and photoluminescence features.

A common means of nondestructive analysis of diamond films is the use of Raman spectroscopy. This is an optical technique in which a fixed energy (wavelength) of illumination is directed onto a sample to be analyzed. Raman scattering in the sample volume produces light with energy different from the excitation energy by either the sum or the difference of phonon energy levels in the solid being probed and the excitation energy. One- and two- phonon Raman scattering effects are known, in which the Raman signals are displaced from the excitation energy by ±1 or ±2 phonon energy levels.

Phonon energy levels in covalent solids like diamond are sensitive to the details of chemical bonding. Thus, diamondbonded carbon produces a Raman shift (energy displacement) of about 1332.5 cm$^{-1}$ (a unit of energy), while graphitically-bonded carbon produces a shift of about 1550 cm$^{-1}$. The shape, position, and intensity of Raman spectral peaks provide information about sample stress, temperature, crystallite size, and defect density.

Figure 1:
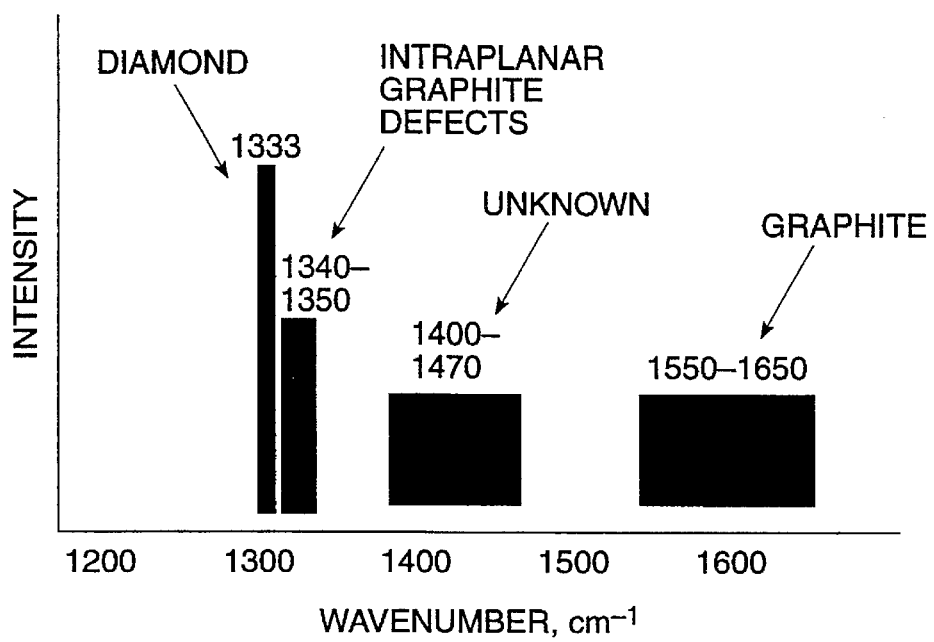
FIG. 1 is a schematic view of the principal Raman features of carbon.
Figure 2:
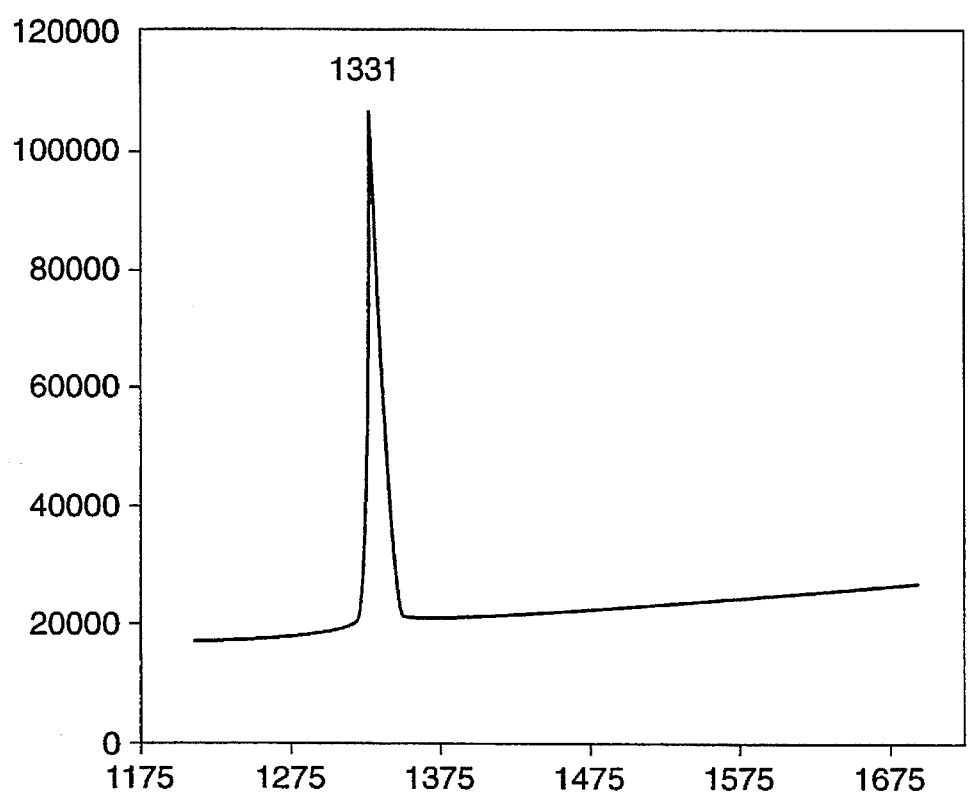
FIG. 2 is a Raman spectrum of a high-quality diamond film with little or no detectable graphitic impurities.

FIG. 1 shows a schematic view of the principal Raman features of carbon, and FIG. 2 shows a Raman spectrum of a high-quality diamond film. Practitioners skilled in the art will recognize that the Raman spectrum shown in FIG. 2 indicates a diamond film with little or no detectable graphitic impurities. However, there is an appreciable "background", or broad-based signal underlying the Raman diamond peak which indicates that the film has a significant degree of disorder at the atomic level. This background signal is generated by photoluminescence mechanisms at defect sites rather than Raman scattering from carbon atoms. These defects can be optically active and serve as a crude measure of disorder in the crystal.

The inventors have discovered a correspondence between Raman characteristics and thermal conductivity of diamond films. It has been discovered that diamond films having optimal thermal properties may be characterized by an intensity ratio of diamond Raman-peak-to-photoluminescence background intensity greater than about 20, intensity ratio of diamond-Raman-peak-to-Raman-graphite-peak greater than about 25, full-width at ½ maximum intensity of diamond Raman peak less than about 6 cm$^{-1}$, and a figure of merit (consisting of the maximum intensity of the diamond Raman peak in counts/sec divided by the intensity of photoluminescence at 1270 cm$^{-1}$)>3.

Figure 3A:
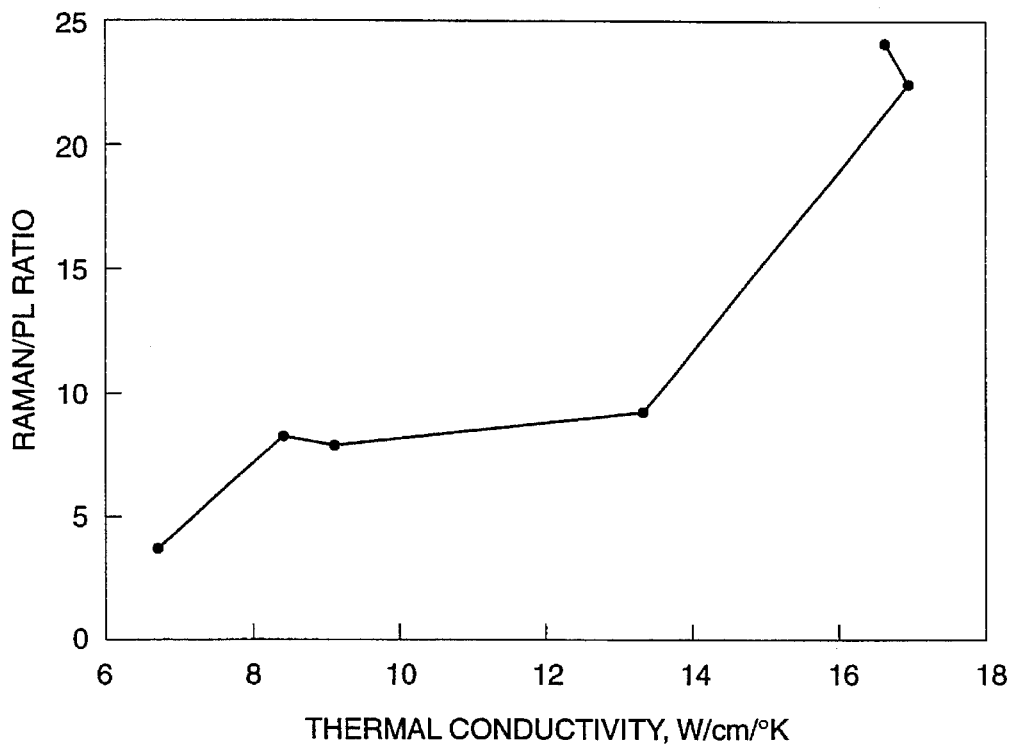
FIG. 3a is a graph showing thermal conductivity in diamond as a function of diamond Raman-peak-to-photoluminescence background intensity ratio.
Figure 3B:
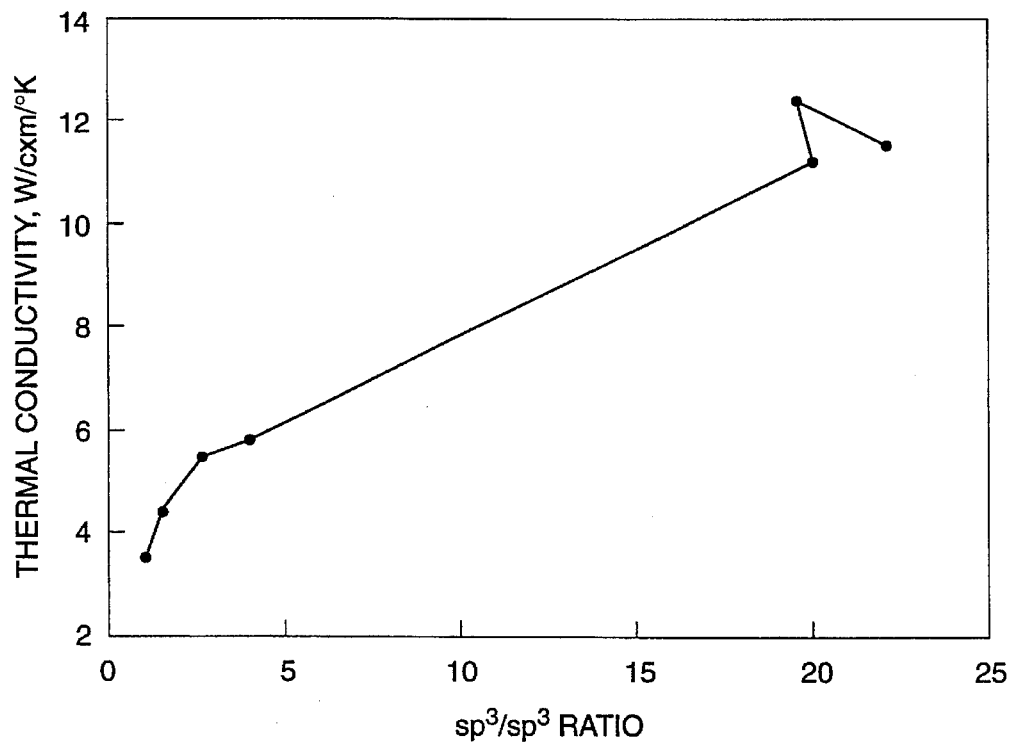
FIG. 3b is a graph showing thermal conductivity in diamond as a function of intensity ratio of diamond-Raman-peak-to-Raman-graphite-peak.
Figure 3C:
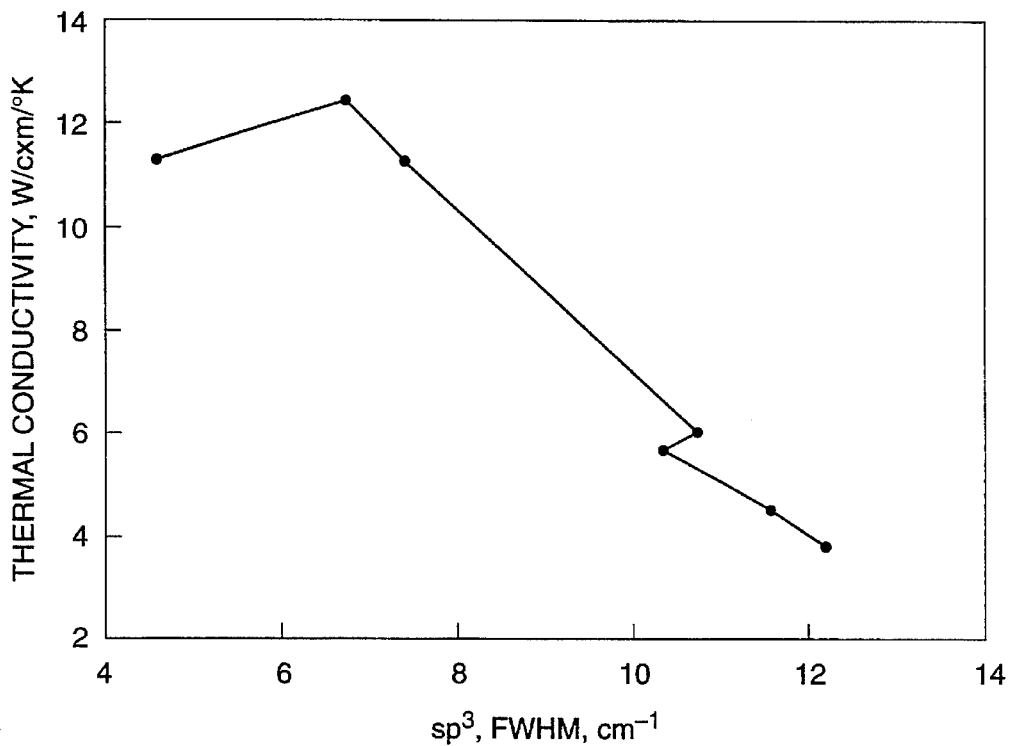
FIG. 3c is a graph showing thermal conductivity in diamond as a function of full-width at ½ maximum intensity of diamond Raman peak.

Together, FIGS. 3a–3c illustrate the maximization of thermal conductivity in diamond according to the present invention. FIG. 3a is a graph showing thermal conductivity in diamond as a function of diamond Raman-peak-to-photoluminescence background intensity ratio. FIG. 3b is a graph showing thermal conductivity in diamond as a function of intensity ratio of diamond-Raman-peak-to-Raman-graphite-peak. FIG. 3c is a graph showing thermal conductivity in diamond as a function of full-width at ½ maximum intensity of diamond Raman peak. Together, FIGS. 3a–3c illustrate the maximization of thermal conductivity in diamond according to the present invention.

Figure 4:
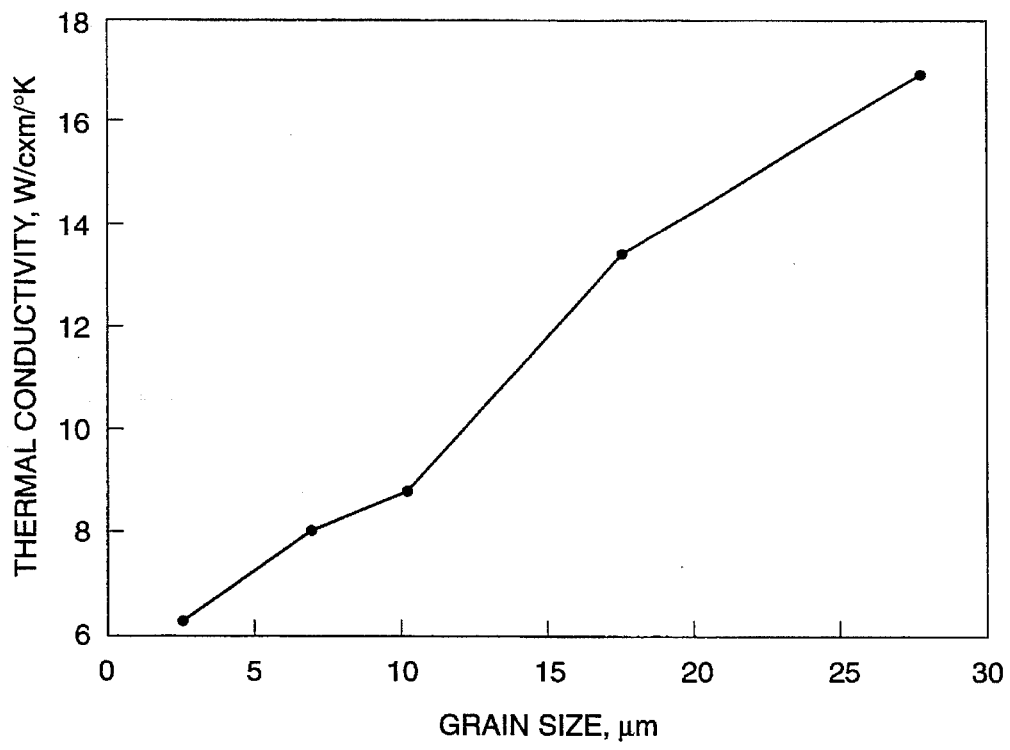
FIG. 4 is a graph showing the correlation between diamond grain size and thermal conductivity.

The crystallite size in diamond films increases as the films grow thicker, given constant deposition conditions. Diamond films of varying thicknesses have been prepared and their crystallite sizes and their thermal conductivity values have been measured. According to the present invention, a strong correlation exists between crystallite size and thermal conductivity. The diamond materials fabricated according to the present invention should have average grain size larger than about 15 microns. FIG. 4 is a graph showing the correlation between diamond grain size and thermal conductivity.

Figure 5:
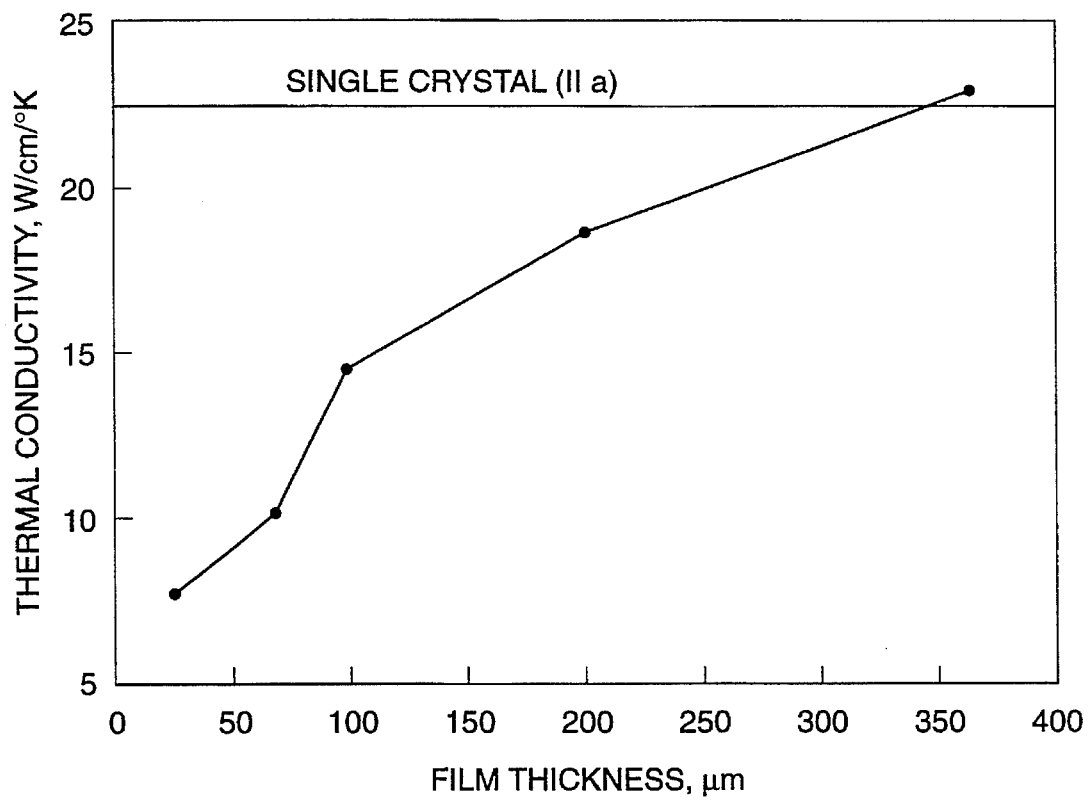
FIG. 5 is a graph showing thermal conductivity of diamond film as a function of film thickness and provides a comparison between the thermal conductivity of diamond films and single crystal (IIa) diamond.

In addition, the observed correlation between film thickness and grain size, coupled with the above correlation of thermal conductivity with grain size, may be used to determine the maximum thermal conductivity of diamond being produced in these experiments. This parameter is termed the "local thermal conductivity" to distinguish it from the composite, or mixed thermal conductivity with grain size. The conductivity of the largest grain CVD diamond films exceeds that of the best single-crystal natural material. FIG. 5 is a graph showing thermal conductivity, of diamond film as a function of film thickness. The horizontal line on FIG. 5 provides a comparison between the thermal conductivity of diamond films and single crystal (IIa) diamond.

Finally, when diamond films are synthesized under conditions which give rise to the measured Raman values cited above, and in addition the carbon precursor materials used are isotopically purified such that the resulting film has substantially less than 0.1 atomic % C$^{13}$ (i.e., substantially more than 99.9 atomic % C$^{12}$), even greater thermal conductivity results as isotopic scattering effects are reduced.

As will be apparent to those of ordinary skill in the art, diamond/non-diamond composite materials, such as those described in co-pending application Ser. No. 07/704,997, filed May 24, 1991, will benefit from incorporation of the material disclosed herein. In particular, synthesis of such composite materials, which may incorporate non-diamond material as well as diamond material, can be carried out over a wider range of non-diamond/diamond material ratios, enhancing the range of properties available from such composite materials. Thus, if the ratio of nondiamond/diamond material in a desired composite is fixed by the need to achieve a certain thermal expansion coefficient, it will be possible, using the high thermal conductivity diamond material of the present invention, to achieve a higher thermal conductivity in the composite while maintaining the required thermal expansion coefficient.

Figure 6:
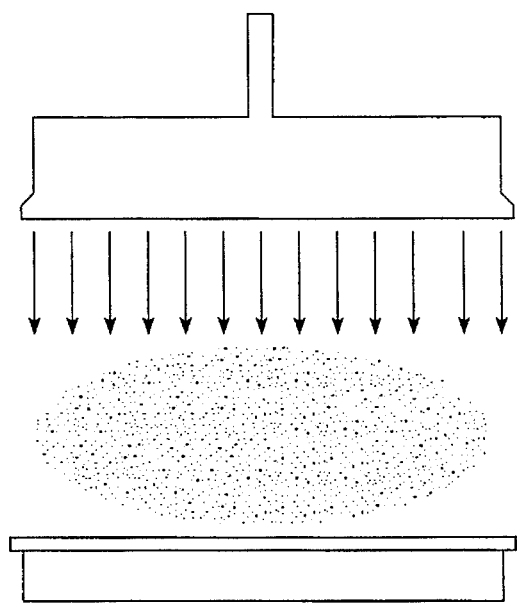
FIG. 6 is a diagram schematically showing gas delivery according to a presently preferred embodiment of the invention, showing the position of the showerhead relative to the plasma.

The high thermal conductivity diamond and diamond-infiltrated diamond/non-diamond composite materials of the present invention may be fabricated using CVD techniques. A CVD reactor in which these materials may be produced is of a type whose design has been optimized for the production of high-quality diamond films. In particular, the reactor is configured to assure control over gas dynamics such that all, or substantially all, of the gas mixture injected into the reactor is injected directly into the plasma ball, such as by means of a "showerhead" gas distribution structure of a type similar to many known to those who are skilled in the art of chemical vapor deposition. The showerhead is preferably positioned over the plasma zone such that the gas flows from the showerhead apertures directly through the plasma zone and impinges immediately on the deposition surface. FIG. 6 is a diagram schematically showing gas delivery according to a presently preferred embodiment of the invention, showing the position of the showerhead relative to the plasma.

Reactor parts should be fabricated from materials chosen to exclude carbon, to eliminate a potential uncontrollable source of carbon during formation of the diamond material produced. Materials suitable for use include molybdenum, quartz, and stainless steel. It is preferable that reactant gas purity levels be controlled such that no single gas exhibits residual impurity levels greater than 1/10,000 parts by volume. Successful production of high thermal conductivity diamond material has been achieved using CVD apparatus as described herein.

EXAMPLE 1

In a plasma CVD reactor suitable for deposition of high-quality diamond films, a diamond film was deposited on a single-crystal silicon wafer using a two-stage deposition protocol. The single-crystal silicon substrate was first prepared for deposition by scratching using diamond powder in a manner well-known to those skilled in the art.

In the first stage of the deposition, which was run for a duration of 30 minutes, a mixture of 200 sccm H$_2$ and 10 sccm CH$_4$, at a pressure of 90 Torr, was allowed to flow through the deposition apparatus. Between about 1,800 and 1,950 watts of microwave power at 2.45 GHz were applied to the deposition chamber, causing the ignition of a sustained plasma. The substrate was held to a temperature ranging between about 625° C. and 675° C.

During the second stage of deposition, the gas mixture was altered to include 200 sccm $H_2$, 4.6 sccm CO, and 9 sccm of $CH_4$. Deposition was carried out for a duration of 451 hours. This protocol resulted in deposition of a diamond film with a thickness of approximately 350 microns.

The diamond film was released from the silicon substrate using well-known chemical etch methods. Using a Nd:YAG laser, a sample was cut from the film and polished using conventional diamond polishing methods. Thermal conductivity was measured and was found to be 17.2 W/cm/° K. at a measurement temperature of approximately 20° C. Peak thermal conductivity of the material was determined to be 23 W/cm/° K., which is in excess of reported single-crystal heteroisotopic diamond (i.e., 20 W/cm/° K.), and far in excess of other reported CVD diamond films.

Those of ordinary skill in the art will appreciate that the preferred embodiment described above, comprising a two-stage deposition process, is not a limitation in the manner in which a diamond material having the attributes described herein may be formed. Another embodiment comprises seeding a substrate, such as the silicon wafer described above, with diamond particles at a density exceeding $10^7$ particles/$cm^2$, and then subsequently exposing the seeded substrate to the deposition process recited as stage two in the two-stage process described herein. A diamond material is produced which is substantially free from voids and which meets all other criteria set out herein for high thermal conductivity diamond material.

It is believed that this process would result in a diamond material having an even higher thermal conductivity if performed using an isotopically pure (i.e., about 99.95 atomic % $C^{12}$) carbon source.

Diamond/non-diamond composite materials may be produced according to the present invention. As disclosed in co-pending application Ser. No. 07/704,997, filed May 24, 1991, such materials may be formed by CVD infusion of diamond into the voids of preforms comprising diamond/non-diamond particulate mixtures.

Figure 7:
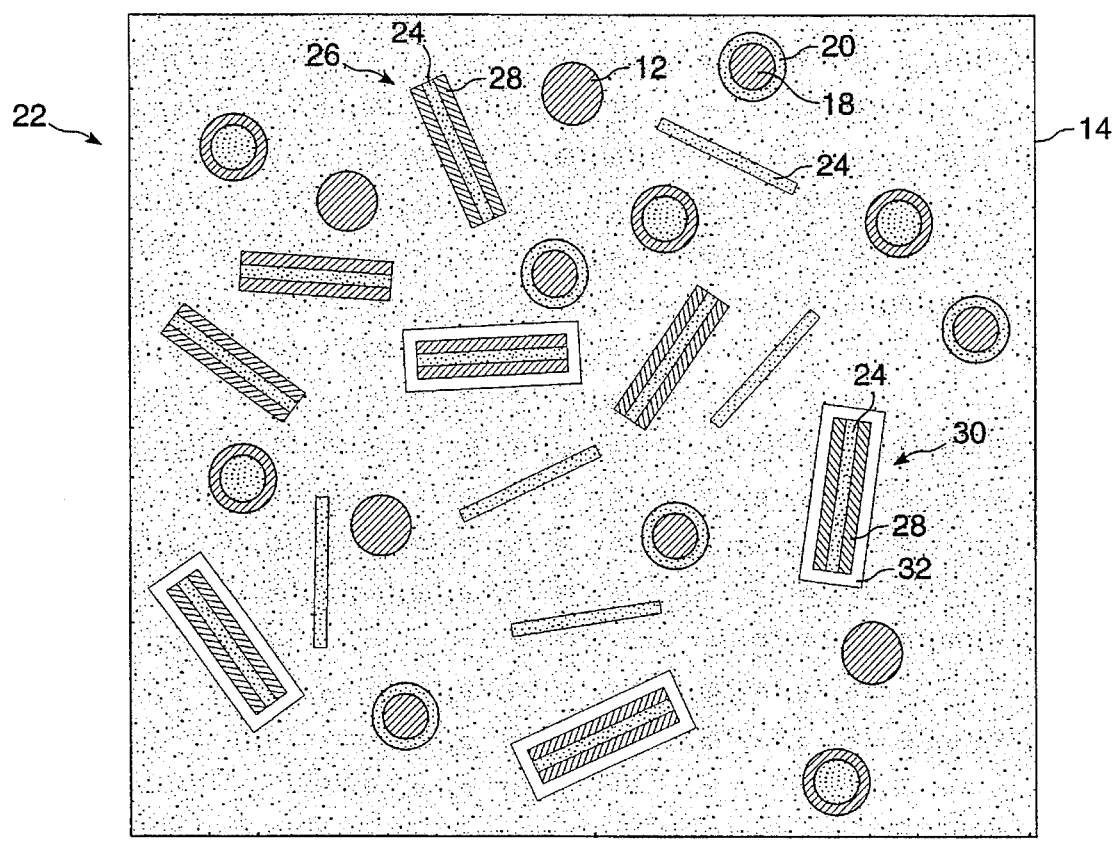
FIG. 7 is a schematic representation of a cross sectional view of a mixed fiber and particle composition consolidated with high thermal conductivity polycrystalline diamond.

As shown in FIG. 7, the particles may be either solid particles 12 or composite particles 18, i.e., particles 18 formed from a first material coated with a layer 20 of a second material. The particles 21 (or the surface portion 20 of composite particles 13) may comprise any material which is compatible with polycrystalline diamond deposition techniques. It is presently contemplated that particles comprised of materials which work well for diamond deposition as substrates in regular flat surface form, including, but not limited to, diamond, silicon nitride, tungsten, tungsten carbide, molybdenum, and silicon will provide suitable particle substrates for consolidation into the compositions of the present invention. It is believed that particulate quartz and alumina may also be consolidated according to the present invention. Particle mixtures of different materials are also consolidated within the scope of the present invention.

According to one embodiment of the present invention, enhancement of thermal conductivity and strength of polycrystalline diamond compact, such as that sold under the trade name Compax by GE Superabrasives of Worthington, Oh., is accomplished by further consolidating it using the present invention. This starting compact material is created by first metal-coating diamond particles and then pressing them together under high pressure and temperature. The metal coating melts and allows the underlying diamond grains to grow partially together. After cooling, the metal matrix may be leached away with a solvent, such as an acid or mixture of acids, leaving a porous network of diamond particles. Consolidation of this material according to the present invention further enhances the physical properties of this material.

The consolidation process of the present invention may be used to consolidate a broad range of particle sizes consistent with the need to employ infiltrated diamond material having a grain size larger than about 15 microns. Those of ordinary skill in the art will appreciate that a lower bound exists for particle size at the point where the amount of inter-particle space available for infiltration with diamond having grain sizes within the bounds of the present invention will be too small to allow the formation of diamond coatings with grain sizes greater than about 15 microns. It will be further appreciated that the particle size at which this occurs is not solely a function of particle size, but depends also on particle shape and the degree to which particles are packed tightly together, both of which can be highly variable. To the extent that this situation pertains, the diamond matrix material produced by CVD infiltration of such a particulate preform will exhibit thermal conductivity which is gradually reduced in accordance with the reduction in grain size of the starting particles. Sizing of the starting particles thus provides another vehicle for controlling the thermal conductivity in composite articles according to the present invention.

It is presently believed that the optimum particle and pore size will depend on the application to which the finished product will be put. For example, the particle and pore size distribution which is best for maximum consolidation will probably be less useful for producing a porous material for use as a filter. Generally, if the particles are too small, the surface will grow over with a solid diamond layer and terminate growth in the interior. If the particles are too large, impractically long deposition times may be required to achieve good consolidation because pore sizes will be large. This consideration will also affect the size of the objects to be fabricated according to the present invention. The center of thicker objects must be assured of consolidation prior to the completion of surface consolidation which cuts off the flow of reactant gases.

Composite materials fabricated by infiltration of high-thermal conductivity diamond formed according to the present invention may be formed with a desired degree of porosity limited on the low end by structural integrity considerations and on the upper end by desired thickness. The infiltrated diamond component of these composite materials will exhibit substantially no voids.

Diamond particles of $10\mu$ and $100\mu$ and silicon carbide particles of $100\mu$ in diameter have been successfully consolidated at an average deposition rate of approximately $1\mu$/hour. At this deposition rate, the $100\mu$ particles form better compositions than the $10\mu$ particles because deposition at and immediately adjacent to the surface of the $10\mu$ particles causes premature closure of the surface porosity (i.e., within about 6–10 hours), resulting in cessation of deposition, and therefore consolidation, within the interior of the material.

It is believed that irregularly shaped (i.e., particles with fracture surfaces and aspect ratios of up to about 3 to 1) particles of natural diamond dust and ordinary synthetic silicon carbide abrasive particles will work satisfactorily. It is presently believed that a uniform pore size leads to the greatest densification under forced flow conditions.

Particle shape will also affect the properties of the finished composite. If particles have a large length/diameter ratio (in excess of about 7/1), they will behave more like fibers and may improve the fracture toughness of the composite material. Other properties, like scattering of polarized light, and directionality of thermal conductivity, may also be affected by use of fiber-like particles.

The present invention also contemplates consolidation of mixtures of diamond and non-diamond particles. Varying the proportions of diamond and non-diamond particles in compositions made according to the present invention allows for the control of important physical properties of the resulting material. For example, thermal expansion, and thermal and electrical conductivity of compositions made according to the present invention may be controlled by altering the ratio of diamond to non-diamond particles from which the composition is made. At a given porosity, the thermal impedance of the composition will be approximately the weighted average of the thermal impedances of the component materials, weighted by volume percent of composition. The high thermal conductivity diamond material of the present invention will further enhance thermal conductivity of the composite materials.

In some circumstances, it may be desirable or necessary to employ particles or fibers which are themselves composites of two or more materials. For example, nickel and iron are poisonous to the diamond deposition process. Consequently, if it is desired to consolidate nickel or iron particles with diamond material, it may be necessary to coat each particle prior to final diamond consolidation with a material which presents a hospitable surface for diamond deposition. Thus a thin layer of metal such as molybdenum or ceramic such as silicon carbide, both of which are known to support diamond deposition, may be applied to the iron or nickel particles to prepare them for consolidation with diamond as earlier described. Additional areas of utility for composite particles as precursors to densify with diamond include modification of electrical, thermal, or mechanical properties through use of appropriate coatings.

A similar process may be used to form composite fibers which may then be used for consolidation with diamond. In this instance, use of composite fibers not only allows use of inhospitable fiber materials and/or modification of selected properties, but also makes available composite fibers which are substantially all diamond for use as elements in the manufacture of a diamond-fiber-reinforced, diamond-consolidated composite material.

For example, when 5μ fibers of silicon nitride (HPZ silicon nitride, available from Dow Corning) are coated with approximately 25μ of diamond through chemical vapor deposition means, a 50μ diameter fiber is formed whose greater portion consists of diamond, and whose properties are substantially those of a pure diamond fiber. This is useful because current technology does not permit the economic manufacture of pure diamond fibers.

Because a critical factor in determining the mechanical properties of fiber reinforced materials is the behavior of the interface between the fiber and the surrounding matrix, it may be desirable to modify the surface chemistry of a diamond composite fiber by applying an outer overcoat layer of an appropriate material. For example, use of a silicon carbide overcoat or a thin metal layer such as molybdenum will increase the adhesive strength between the diamond composite fiber and the surrounding matrix.

FIG. 7 is a schematic representation of a cross sectional view of a mixed fiber and particle composition 22 consolidated with polycrystalline diamond 14. Non-diamond fibers, for example silicon carbide, silicon nitride, or alumina, are shown at reference numeral 24. Diamond-consolidated fibers are shown at reference numeral 26, comprising a non-diamond fiber 24 coated with a layer of diamond 28. Diamond-consolidated fibers comprising a non-diamond fiber 24, coated with a layer of diamond 28 and overcoated with non-diamond layer 32, comprising substances, for example quartz, silicon carbide, silicon nitride, or alumina, are shown at reference numeral 30. For illustrative purposes only, the mixed fiber and particle composition 22 of FIG. 7 is shown comprising several types of fibers and particles which may be consolidated according to the present invention. Those of ordinary skill in the art will recognize that an actual mixed fiber and particle composition 22 formed according to the present invention may contain one or more of the types of particles and/or fibers actually shown in FIG. 7.

There appears to be no inherent limitation regarding the ratio of diamond to non-diamond particles which may be consolidated according to the present invention, so long as the material of which the non-diamond particles are comprised is compatible with diamond 14 deposition, and is of a size range which will allow proper consolidation. With respect to size range ratios, there will be various optimum particle size distributions depending on specific process operating conditions. By properly tailoring the pore size distribution as a function of position within the mass being consolidated to compensate for deposition rate differences, it may be possible to achieve higher densification than with a simple uniform pore size distribution.

For example, a higher overall degree of consolidation may be achieved by fabricating preforms such that pores most distant from the source of reactant gases are smaller than those closest to the source of reactant gases. This average reduction of pore size with increasing distance from the reactant gas source compensates for the reduction in growth rate which occurs with increasing distance from reactants. This technique may be used in combination with imposed thermal gradients and/or controlled gas flow methods, but is particularly useful when thermal gradients and/or controlled gas flow techniques cannot be employed due to specific application or engineering requirements.

One major controlling factor in the process according to the present invention is the deposition rate. For example, if the average particle and pore size are about 100μ, a growth rate of 1 μ/hr will close off the average pore in 50 hours. A presently preferred maximum growth rate is about 1% of the average particle size, expressed in microns/hr. Thus, a particle preform having average particle sizes of about 100μ can be consolidated using a process with a deposition rate of about 1μ/hr. This is a rule of thumb rather than a hard and fast rule, and departures from this rule will be fairly common, depending on particle shape, whether more than one particle size is present, and on whether thermal gradients and gas flows in the process are arranged to modify local deposition rates.

For example, a way to increase the degree of consolidation of a composition according to the present invention is to arrange for the region most distant from the plasma or other reactant source to be the hottest. Because deposition rate is a strong function of temperature, this compensates for the tendency for the regions nearest to the plasma to grow more quickly, and postpones premature termination of consolidation resulting from closure of gas diffusion passages. Under these circumstances, a faster deposition rate may be useable.

Although the foregoing discussion of consolidation of particulates by chemical vapor infiltration has focussed on the use of polycrystalline diamond as a matrix material, those of ordinary skill in the art will recognize that operative embodiments of the present invention can be used to consolidate diamond particles in the variety of forms discussed herein by chemical vapor infiltration of non-diamond matrix materials such as silicon carbide. This process produces a further variety of diamond composite materials having desirable properties and broadens the commercial utility and application of diamond composite materials. A specific example of such a system is the consolidation of diamond particles by chemical vapor infiltration of silicon carbide matrix material, using methane and silane gas chemistry as is well known in the art.

The particles may be precleaned by rinsing them with isopropyl alcohol and drying them on filter paper. The particles may then be premixed as required. To prepare particle mixtures, the appropriate amounts are weighed out in the dry state and the weighted amounts are transferred into a beaker or crucible for subsequent mixing.

Small amounts of a liquid, such as isopropyl alcohol or polyvinyl alcohol are preferably added to the dry particle mix to form a pourable slurry. The properties of the ideal slurry-forming liquid, or vehicle, include somewhat elevated viscosity (to prevent rapid settling of particles after mixing) and complete, residue-free evaporation from the slurry after pouring into a mold.

The slurry is then poured into a mold having the desired shape of the finished consolidated article and the slurry vehicle is allowed to evaporate, either unaided, or with the assistance of vacuum and/or heat, to leave a particle preform. Too rapid vehicle removal causes bubble or void formation in the finished preform. For uniform thickness, the mold must be kept level. This is especially important for thin, wide items, as slight tilts cause the slurry to pile up at one side of the mold.

On the other hand, deliberate mold tilting may be employed to obtain linear thickness variation if desired. In addition, a circular mold may be spun to obtain a parabolic thickness distribution through the interaction of centrifugal force and gravity.

Mold material and surface finish can be important, depending on the desired result. Ideally, a mold should be made of a material to which diamond does not strongly adhere or grow upon, to ease post-deposition mold separation. The mold surface texture is replicated in the adjacent consolidated material, so smooth finishes may be obtained in the completed material if a mold with a polished surface is employed. Molds can also include shapes of various types which give contour and relief to the finished material. This is an especially important capability in that it reduces or eliminates the need for post-deposition machining, an important cost-reduction consideration in view of the hardness of the finished product.

A circular copper gasket with an inner diameter of 2.25 inches centered on the polished surface of a silicon wafer has been shown to function satisfactorily as a mold. A copper gasket about 2 mm thick has been employed, although other thicknesses may be employed. The gasket is simply placed on the wafer and is kept in place by gravity. The silicon surface is extremely flat and smooth, and is compatible with the diamond deposition environment. It is easily etched away following deposition.

The isopropyl alcohol vehicle may be removed by evaporation accelerated with gentle heating. The mold is placed on a levelled hot plate, and the slurry is poured into the mold. Generally, the seal between the copper gasket and the wafer surfaces is good enough that very little liquid leaks out. The particles are too large to be carried along small leak paths. After the slurry is poured and levelled (if needed), the hot plate is turned on and the slurry temperature is allowed to increase to about 40–45° C. Evaporation takes about 2 hours.

When the vehicle has evaporated, the copper gasket is carefully removed by lifting it vertically off the wafer. This leaves a disc of loosely-bound particles on the wafer. The copper gasket is removed because copper is not compatible with the diamond deposition process. The preform particle composite disc is placed, still on the underlying wafer, in a diamond deposition system as described above herein.

The power required to maintain a specific temperature changes during consolidation as the thermal conductivity and radiation properties of the consolidating material change during the process.

After initial consolidation of the particulate preform article has been achieved and the preform article mass has acquired an enhanced degree of mechanical integrity (about twelve hours), the second stage of deposition preferably includes rotating the support platform upon which the preform article rests. In a presently preferred embodiment, the rotational speed is between about 60 and 2,000 rpm, preferably about 300–600 rpm. In a .presently preferred embodiment, the plasma may be simultaneously displaced from the center of the support platform to a position at about one half the radius of rotation of the preform article. The combination of rotation and plasma displacement provides more uniform heating of the preform article and leads to better deposition uniformity. In another preferred embodiment, the plasma position may be rapidly varied over the rotating or stationary preform through means of phase modulation of either or both the incident or reflected microwave energy which define the plasma location within the deposition chamber. This has the effect of increasing deposition area and uniformity.

After continuation of the second deposition phase for between approximately 48 to 168 hours, depending on the degree of porosity desired, the preform thickness, particle size, and growth rate achievable under required process conditions, during which microwave power is increased to maintain sample temperatures, deposition is terminated by switching off the microwave power supply and discontinuing the flow of methane gas. The excess methane gas may be removed from the chamber by momentarily opening a high flow rate valve between the chamber and the vacuum pump. The sample is allowed to cool, preferably under flowing hydrogen gas at a pressure of about 100 torr.

After cooling and removal from the reaction chamber, the silicon or other substrate support may be removed by etching. Where the support substrate is a silicon substrate, it may be dissolved in a 2:1 mixture by volume of concentrated reagent grade $HNO_3$ and HF, which is sufficient to remove the silicon substrate without attacking the densified ceramic diamond article.

The composite articles of the present invention may be formed in holes or other recesses of non-diamond materials prepared by etching, drilling or other mechanical processes to accept regions of diamond or non-diamond solid or composite particles. According to this aspect of the invention, a substrate material, such as silicon carbide, beryllium, aluminum, or other material compatible with diamond forming processes is prepared by forming one or more holes or other recesses. Particles to be consolidated are placed in the hole or recess and the loaded substrate material is placed in the diamond growth reactor. Consolidation of the particles is performed as disclosed herein. Where the substrate material is one to which deposited diamond will adhere, no other means need be used to secure the position of the consolidated mass in the hole or recess of the substrate material. Where the substrate material is one to which diamond has poor adhesion, the hole or recess can be formed using undercuts, i.e., its diameter increases with its depth below its surface. The diamond consolidated particle mass will be interlocked with the substrate material and thus be held thereto by a mechanically stable bond.

One limitation on the production of diamond consolidated particle compositions by chemical vapor infiltration is that there exists a limit on the thickness of the article which can be produced. This limitation occurs because, at some thickness determined by the particular process parameters in use, it is no longer possible to transport the necessary growth species from the surface of the article to its interior. This places limits on the commercial usefulness of diamond composite materials because there are items which, by their nature, require substantial section thicknesses for their manufacture. Examples of such articles which may require thick sections include turbine blades, metrology gauge blocks, and ceramic vacuum tube envelopes.

According to another aspect of the present invention, articles having sectional portions of arbitrary thickness may be formed if the process is carried out by addition of new particulate material to the surface of the article undergoing consolidation. Such a process is illustrated in FIGS. 8a–8e, a series of cross sectional views of a diamond consolidated article at various points in the process.

Figure 8A:
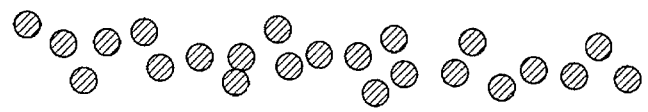
FIGS. 8A, 8b, 8c, 8d, and 8r illustrate a process for forming composite articles having sectional portions of arbitrary thickness by addition of new particulate material to the surface of the article undergoing consolidation.
Figure 8B:
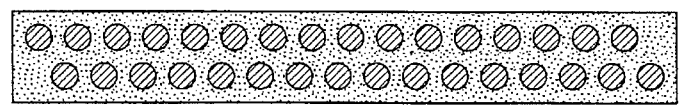

Referring first to FIG. 8a, the initially unconsolidated particles are shown formed into a preform of a desired shape. FIG. 8b shows the article after particle consolidation has been completed according to the teachings of the present invention.

Figure 8C:
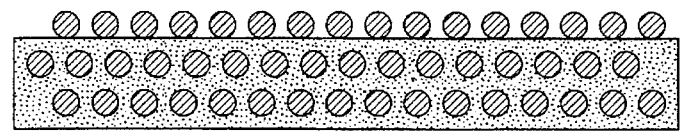
Figure 8D:
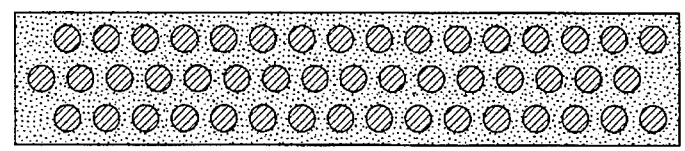

Next, as shown in FIG. 8c, additional particles are added to the surface of the now consolidated article and further particle consolidation of the newly placed particles is accomplished, resulting in the thicker consolidated article shown in FIG. 8d. It is presently contemplated that two possible modes of operation of this phase of the process are possible. In a first batch mode, the consolidated article of FIG. 8b is removed from the deposition chamber, or the chamber is at least opened, and the additional particles are placed on the surface of the article. The deposition chamber is then closed and further deposition is performed to consolidate the new particles. Performance of this variation in the process will result in discernable boundaries within the article at the locations across the cross section of the article representing the surfaces where the new particles were placed.

Figure 8E:
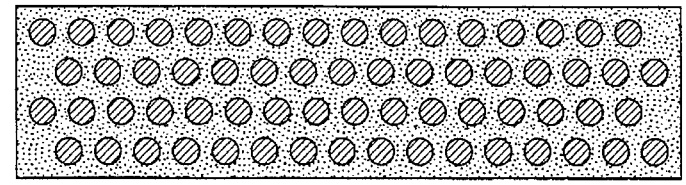

In certain applications, the boundaries within the article may have deleterious effects on the strength of the finished composite article. Where these features are undesirable in the finished article, a continuous process may be performed wherein additional particles are continuously added to the surface of the article at a rate determined by the progress of the consolidation process. For example, a consolidation process may be carried out in which particles to be consolidated are, dispensed in a slow continuous fashion using any of a number of particle dispenser mechanisms, including vibrating hoppers, impact hoppers, screw-driven particle feeds, or gas puff particle feeds. The particle feed rate is adjusted such that the average particle feed rate is not greater than the effective consolidation rate, i.e., such that particles are substantially fully incorporated into the underlying consolidated mass before an excessive depth of new particles are added. In this fashion, a continuous densified layer is formed by accretion of particles and infiltration of polycrystalline diamond matrix material. The particulars of particle feed rate are determined by such factors as matrix deposition rate, particle shape, particle size, and reaction temperature. A further advantage of continuous particle feed and consolidation is that the average depth of porous material which must be consolidated can be kept relatively shallow compared with the sections consolidated in batch processes, and therefore will be less subject to matrix material compositional variation with depth, producing a more uniform product.

Where batch processing is employed, the process steps illustrated by FIGS. 8c and 8d may be repeated as many times as necessary to obtain a finished article having a desired thickness as shown in FIG. 8e. Where continuous processing is utilized, the particle feed is stopped when enough material is present in the article to achieve the desired end thickness.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for forming a coating on a substrate to form a coated article, said coating consisting essentially of diamond, said diamond characterized by being substantially free of voids, having an average crystallite size greater than about 15 microns, said coating having a maximum intensity of the diamond Raman peak in counts/sec divided by the intensity of photoluminescence at 1270 $cm^{-1}$ greater than about 3, a Raman $sp^3$ full width half maximum less than about 6 $cm^{-1}$ and a diamond-to-graphite Raman ratio greater than about 25, comprising the steps of:

preparing said substrate by abrasion with diamond particles;

placing said substrate in a CVD reactor suitable for diamond deposition;

depositing diamond in said CVD reactor during a first deposition stage by providing an atmosphere consisting essentially of a mixture of about 200 sccm $H_2$ and 10 sccm $CH_4$, at a pressure of about 90 Torr, providing between about 1,800 and 1,950 watts of microwave power at a frequency of about 2.45 GHz to ignite and sustain a plasma in the region of said substrate, and maintaining said substrate at a temperature of between about 625° C. and 675° C. for a period of time sufficient to form a diamond layer which is substantially continuous;

depositing diamond in said CVD reactor during a second deposition stage by providing an atmosphere consisting essentially of a mixture of about 200 sccm $H_2$, 4.6 sccm CO, and 9 sccm of $CH_4$ at a pressure of about 90 Torr, providing between about 1,800 and 1,950 watts of microwave power at a frequency of about 2.45 GHz to ignite and sustain a plasma in the region of said substrate, and maintaining said substrate at a temperature of between about 625° C. and 675° C. for a period of time sufficient to form a diamond layer having a desired thickness; and removing said substrate from said CVD reactor.

2. The method of claim 1, further including the step of separating said diamond layer from said substrate.

* * * * *

UNITED STATES PATENT AND TRADEMARK OFFICE
CERTIFICATE OF CORRECTION

PATENT NO. : 5,496,596
DATED : March 5, 1996
INVENTOR(S) : John A. Herb, et al.

Page 1 of 2

It is certified that error appears in the above-indentified patent and that said Letters Patent is hereby corrected as shown below:

On the title page,

In the section entitled "Notice", replace the date "Dec. 21, 2010" with --Nov. 8, 2011--.

In the second entitled "Related U.S. Application Data", replace "Ser. No. 32,167, Mar. 30, 1987, Pat. No. 4,743,073" with --Ser. No. 32,169, Mar. 30, 1987, abandoned--.

In the ABSTRACT, line 19, delete the letter "a" before "diamond".

In the ABSTRACT, line 21, replace "ccm" with --sccm--.

Column 1, lines 14-15, replace "Ser. No. 07/032,167, filed Mar. 30, 1987, now U.S. Patent No. 4,743,073" with --Ser. No. 07/032,169, filed Mar. 30, 1987, now abandoned--.

Column 1, line 36, replace "watts/cm/° K." with --watts/cm/°K.--.

Column 1, line 40, replace "4.3W/cm/° K." with --4.3W/cm/°K.--.

Column 3, line 60, replace "W/cm/° K." with --W/cm/°K.--.

Column 4, line 23, replace "8r" with --8e--.

UNITED STATES PATENT AND TRADEMARK OFFICE
CERTIFICATE OF CORRECTION

PATENT NO. : 5,496,596
DATED : March 5, 1996
INVENTOR(S) : John A. Herb, et al.

It is certified that error appears in the above-indentified patent and that said Letters Patent is hereby corrected as shown below:

Column 7, line 12, replace "W/cm/° K." with --W/cm/°K.--.

Column 7, line 15, replace "W/cm/° K." with --W/cm/°K.--.

Column 7, line 42, delete the second occurrence of "18".

Column 7, line 44, replace "21" with --12--.

Column 7, line 45, replace "13" with --18--.

Column 10, line 21, delete "14".

Column 11, line 1, after "diamond" insert --14--.

Signed and Sealed this

Third Day of December, 1996

Attest:

BRUCE LEHMAN

*Attesting Officer*     *Commissioner of Patents and Trademarks*